(12) United States Patent
Goodwin

(10) Patent No.: US 7,279,258 B2
(45) Date of Patent: Oct. 9, 2007

(54) METHOD AND ARRANGEMENT FOR CONTROLLING FOCUS PARAMETERS OF AN EXPOSURE TOOL

(75) Inventor: Francis Goodwin, Delmar, NY (US)

(73) Assignee: Infineon Technologies Richmond, LP, Sandston, VA (US)

( * ) Notice: Subject to any disclaimer, the term of this patent is extended or adjusted under 35 U.S.C. 154(b) by 671 days.

(21) Appl. No.: 10/798,332

(22) Filed: Mar. 12, 2004

(65) Prior Publication Data

US 2005/0202327 A1 Sep. 15, 2005

(51) Int. Cl.
*G03F 9/00* (2006.01)
(52) U.S. Cl. .......................... 430/30; 382/145; 382/149
(58) Field of Classification Search ................ 430/30; 382/145, 149
See application file for complete search history.

(56) References Cited

U.S. PATENT DOCUMENTS 5,965,309 A * 10/1999 Ausschnitt et al. ........... 430/30
5,976,740 A * 11/1999 Ausschnitt et al. ........... 430/30

* cited by examiner

*Primary Examiner*—Christopher G. Young
(74) *Attorney, Agent, or Firm*—Edell, Shapiro & Finnan LLC

(57) ABSTRACT

A pattern can be projected on a resist film layer deposited on a semiconductor surface. The pattern can include structural elements having different feature sizes. Structural elements having feature sizes below a certain limit are not resolved on the resist film layer. The dimension of the corresponding resist pattern can be reduced and the difference can be related to focus parameters of the exposure tool.

15 Claims, 10 Drawing Sheets

METHOD AND ARRANGEMENT FOR CONTROLLING FOCUS PARAMETERS OF AN EXPOSURE TOOL

FIELD OF THE INVENTION

The invention relates to a method for controlling focus parameters of an exposure tool in a lithographic process for patterning a substrate of a semiconductor wafer, and to an arrangement for controlling focus parameters of an exposure tool during lithographic exposure. More particularly, the invention relates to the field of lithography and to controlling the accuracy of critical dimensions of structures projected into different layers on a semiconductor wafer.

BACKGROUND OF THE INVENTION

The manufacturing of integrated circuits includes repeatedly projecting a pattern in a lithographic step onto a semiconductor wafer and processing the wafer to transfer the pattern into a layer deposited on the wafer surface or into the substrate of the wafer. This processing includes depositing a resist film layer on the surface of the semiconductor substrate, projecting the pattern onto the resist film layer, and developing or etching the resist film layer to create a resist structure. The resist structure is transferred into a layer deposited on the wafer surface or into the substrate in an etching step. Planarization and other intermediate processes may further be necessary to prepare a projection of a successive mask level.

The pattern being projected is provided on a photo mask. The photo mask is illuminated by a light source having a wavelength, which is selected in a range from visible light to deep-UV in modern applications. The part of the light, which is not blocked or attenuated by the photo mask, is projected onto the resist film layer on the surface of the semiconductor wafer.

In order to manufacture patterns having line widths in the range of 70 nm or smaller, large efforts have to be undertaken to guarantee sufficient dimensional accuracy of patterns projected onto the resist film layer. The dimensional accuracy of patterns depends on many factors, e.g., the illumination condition of the exposure tool, the characteristics of the resist film layer with respect to exposure dose in different regions on the wafer, and under varying illumination conditions. Control of dimensional accuracy is performed by measuring the size of portions of a test pattern of the current layer with an inspection tool. Typically, CD-SEM structures are used to quantify the amount of deviation from the design value, e.g., by using a SEM-tool. It is also quite common to use scatterometry marks, which are inspected with a spectroscopic ellipsometer.

One possibility of assessing the accuracy of critical dimensions is related to focus parameters of the exposure tool used for projecting the pattern. Usually a process window is defined, which allows for small variations of the parameters for illumination. A critical parameter is the depth-of-focus, which gives the amount of allowable focus change. A change in focus usually results in loss of contrast, degrading the resolution of the image projected on the wafer. In order to understand how this translates into critical dimension inaccuracies the response of the resist film layer has to be taken into account. In conventional broad band illumination, i.e., g-line or i-line Mercury light sources with 356 nm wavelength, the observed change in dimensions and edge contrast could be used.

With the advent of light sources having a shorter wavelength, i.e., 248 nm or 193 nm as used nowadays, the determination of line end shortening or reduced edge contrast gets increasingly difficult. Recently chemically amplified resists are available. These type of resists show a very steep characteristic in blackening the resist for a given range of exposure doses. Using such a resist decreases the response of the resist to variations of image contrast. Therefore, conventional methods, as discussed above, are less sensitive to variations of focus, increasing the difficultly in determining the optimum focus settings of the exposure tool.

However, with decreasing feature sizes of patterns the precise determination of dimensional accuracy gets even more important, as those technologies already start with a relatively small process window. Non-systematic errors, like focus parameters, become more and more important. Failing to control those parameters would ultimately result in a low yield of the produced circuits.

SUMMARY OF THE INVENTION

A method for controlling focus parameters of an exposure tool in a lithographic process for patterning a substrate of a semiconductor wafer can include providing a bare semiconductor wafer substrate or a substrate formed by depositing a film onto the surface of a semiconductor wafer; providing a pattern having a first edge and a second edge, the first edge and the second edge can be substantially parallel and limiting the pattern; selecting a first structural element and a second structural element; selecting the characteristic feature size of the first structural element larger than the characteristic feature size of the second structural elements when the first distance is larger than the second distance; selecting the characteristic feature size of the first structural element substantially equal to the characteristic feature size of the second structural elements when the first distance is substantially equal to the second distance; disposing the pattern on a photo mask; depositing a photoresist film layer on a surface of the substrate; projecting the pattern onto the photoresist film layer using the photo mask in the exposure tool having a characteristic focus parameter; developing the photoresist film layer to form a three-dimensional resist pattern on the surface of the substrate by removing a first part of the photoresist film layer being exposed with a first exposure dose; determining a first dimension of the resist pattern between the corresponding first edge and the corresponding second edge; and determining the characteristic focus parameter of the exposure tool as a function of the first dimension of the resist structure.

The pattern can include a plurality of structural elements. Each structural elements can have a characteristic feature size. The first structural element can have a first distance to the first edge and the second structural element can have a second distance to the first edge. The resist pattern corresponding to the pattern and having a corresponding first edge and a corresponding second edge.

The method steps can be performed with an exposure tool and a photo mask being used for patterning a resist film layer on a surface of a semiconductor wafer. The semiconductor wafer can be structured with a pattern provided by the photo mask. The dimensional accuracy of the corresponding resist structure can be measured and determined by the present invention.

A method for controlling focus parameters of an exposure tool can include providing an exposure tool having a characteristic minimal resolution, providing a line shaped pattern having a width, selecting the feature sizes as a function of the distance of the features to the first edge, exposing an image of the line shaped pattern onto a resist film layer on a substrate to create a latent image of the line shaped pattern, determining the minimal resolution by comparing the further width of the latent image and the width of the line shaped pattern, and determining the focus parameter as a function of the minimal resolution.

The minimal resolution can depend on a focus parameter of the exposure tool. The line shaped pattern can include a plurality of individually sized textures and can have a first edge and a second edge. The first edge and the second edge can limit the width of the line shaped pattern. The feature sizes can decrease monotonically from a maximum value close to the first edge to a minimum value close to the second edge. The latent image can have a further width. The further width can be less than or equal to the width as a function of the minimal resolution.

In both aspects, a pattern can be projected on a resist film layer deposited on a semiconductor surface. The pattern can include structural elements having different feature sizes. Structural elements having feature sizes below a certain limit are not resolved on the resist film layer. The dimension of the corresponding resist pattern can be reduced and the difference can be related to focus parameters of the exposure tool.

The step of determining the first dimension of the resist pattern can also include recording an image in a measurement region. The measurement region can include the corresponding first edge and the corresponding second edge.

According to this embodiment, determining the size of the resist pattern can be performed by recording an image of the resist pattern, which can be analyzed using a pattern recognition system.

A measurement pattern can be used as an overlay target, an alignment mark, a scatterometry mark, or a critical dimension measurement bar. The measurement pattern can be disposed on the photo mask, wherein the pattern can form a sub-portion of the measurement pattern.

In this embodiment, the size of the resist pattern can be measured using conventional tools. A difference in size of the resist pattern can translate into an, e.g., artificial overlay error, which can be minimal for a projection with optimal focus conditions.

An arrangement for controlling focus parameters of an exposure tool during lithographic exposure can include a semiconductor wafer with a substrate having a photoresist film layer on a surface of the substrate, a pattern on a photo mask, a first selector or means for selecting a first structural element and a second structural element, a second selector or means for selecting the characteristic feature size of the first structural element larger than the characteristic feature size of the second structural elements when the first distance is larger than the second distance, a third selector or means for selecting the characteristic feature size of the first structural element substantially equal to the characteristic feature size of the second structural elements when the first distance is substantially equal to the second distance, a projector or means for projecting the pattern onto the photoresist film layer using the photo mask in an exposure tool having a characteristic focus parameter, a developer or means for developing the photoresist film layer to form a three-dimensional resist pattern on the surface of the substrate by removing a first part of the photoresist film layer being exposed with a first exposure dose, means for determining a first dimension of the resist pattern between the corresponding first edge and the corresponding second edge, and means for determining the characteristic focus parameter of the exposure tool as a function of the first dimension of the resist structure.

The pattern can have a first edge and a second edge. The first edge and the second edge can be substantially parallel and can limit the pattern. The pattern can include a plurality of structural elements. Each of the structural elements can have a characteristic feature size. The first structural element can have a first distance to the first edge and the second structural element can have a second distance to the first edge. The resist pattern can correspond to the pattern and can have a corresponding first edge and a corresponding second edge.

The present invention can improve the accuracy of an focus controlling step performed in semi-conductor manufacturing. In particular, focus parameters of an exposure tool can be derived, when these are represented by measurements using a resist pattern printed on the wafer. Also, an increase in yield and a reduction in costs in semiconductor manufacturing can be provided.

BRIEF DESCRIPTION OF THE DRAWINGS

The above features of the present invention will be more clearly understood from consideration of the following descriptions in connection with accompanying drawings in which.

DETAILED DESCRIPTION

Figure 1:
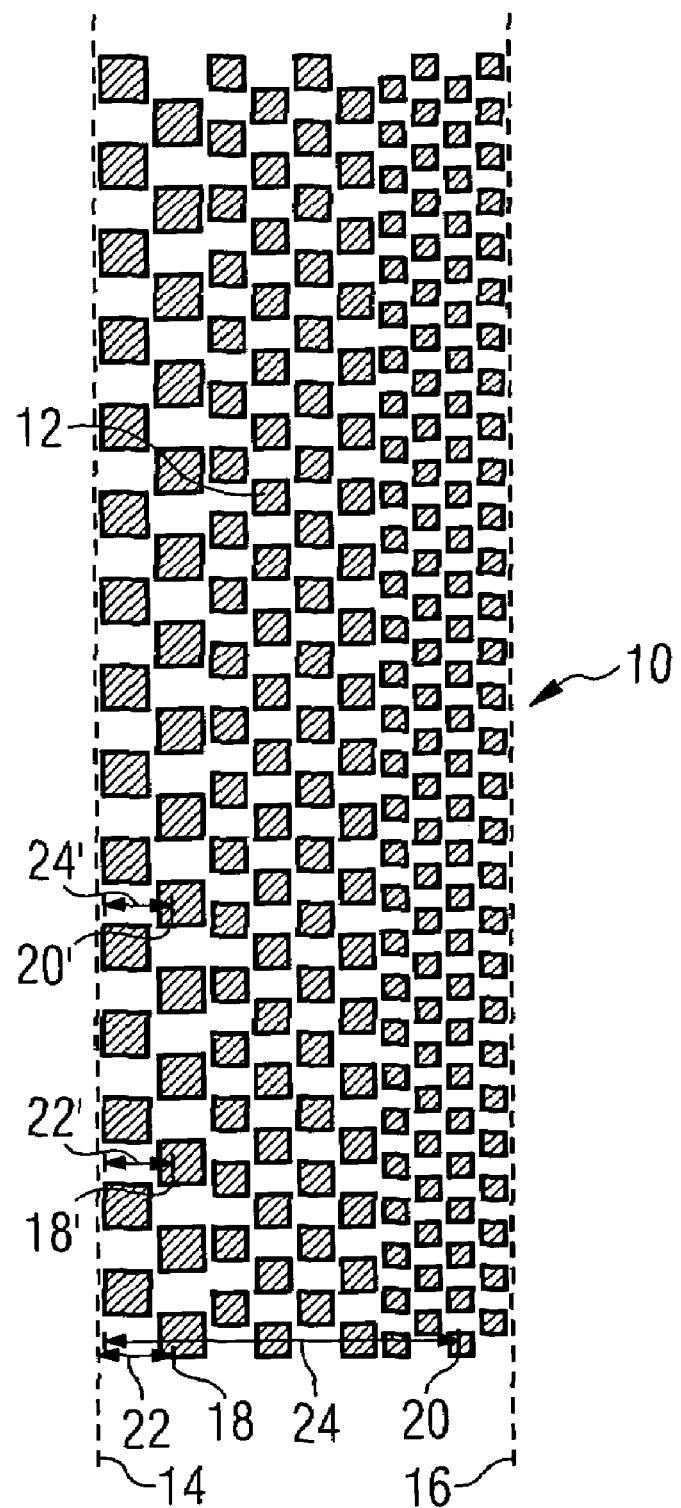
FIG. 1 illustrates a pattern with structural elements on a photo mask usable for clear-field imaging.

FIG. 1 illustrates a pattern 10 including a plurality of structural elements 12. The structural elements 12 can be disposed between a first edge 14 and a second edge 16, which can be substantially parallel and can limit the pattern 10 in one dimension. Each of the structural elements 12 can have a respective characteristic feature size, which can be selected according to the distance of the structural element 12 to the first edge 14.

In FIG. 1 the structural elements 12 are shown as square shaped elements, using, e.g., the area of a square shaped element as its respective characteristic feature size. In general other shapes can also be employed, e.g., circular shaped elements.

In the following, the selection of the characteristic feature size is explained by choosing two exemplary structural elements in a direction perpendicular to the first edge 14. In FIG. 1, a first structural element 18 and a second structural element 20 are shown. The first structural element 18 can have a first distance 22 to the first edge 14. The second structural element 20 can have a second distance 24 to the first edge 14. As the first distance 22 can be smaller than the second distance 24, the characteristic feature size of the first structural 18 element can be larger than the characteristic feature size of the second structural element 20. This applies for the other structural elements shown in FIG. 1 as well.

In a direction parallel to the first edge 14, the sizing of the structural elements is again illustrated with respect to two exemplary structural elements. In FIG. 1 a first structural element 18' and a second structural element 20' are shown. The first structural element 18' can have a first distance 22' to the first edge 14. The second structural element 20' can have a second distance 24' to the first edge. As the first distance 22' can be substantially equal to the second distance 24'. The characteristic feature size of the first structural element can be equal to the characteristic feature size of the second structural element. This applies for the other structural elements shown in FIG. 1 as well.

This yields to the pattern 10 as shown in FIG. 1. In general, the pattern 10 used by the invention can have feature sizes of the structural elements 12 decrease along a first dimension and remain substantially constant in a direction perpendicular to the first direction. The dimensions of the structural elements 12 will be discussed below. It should be noted that the smallest feature size can be smaller than the minimal printable resolution of an exposure tool.

Figure 2:
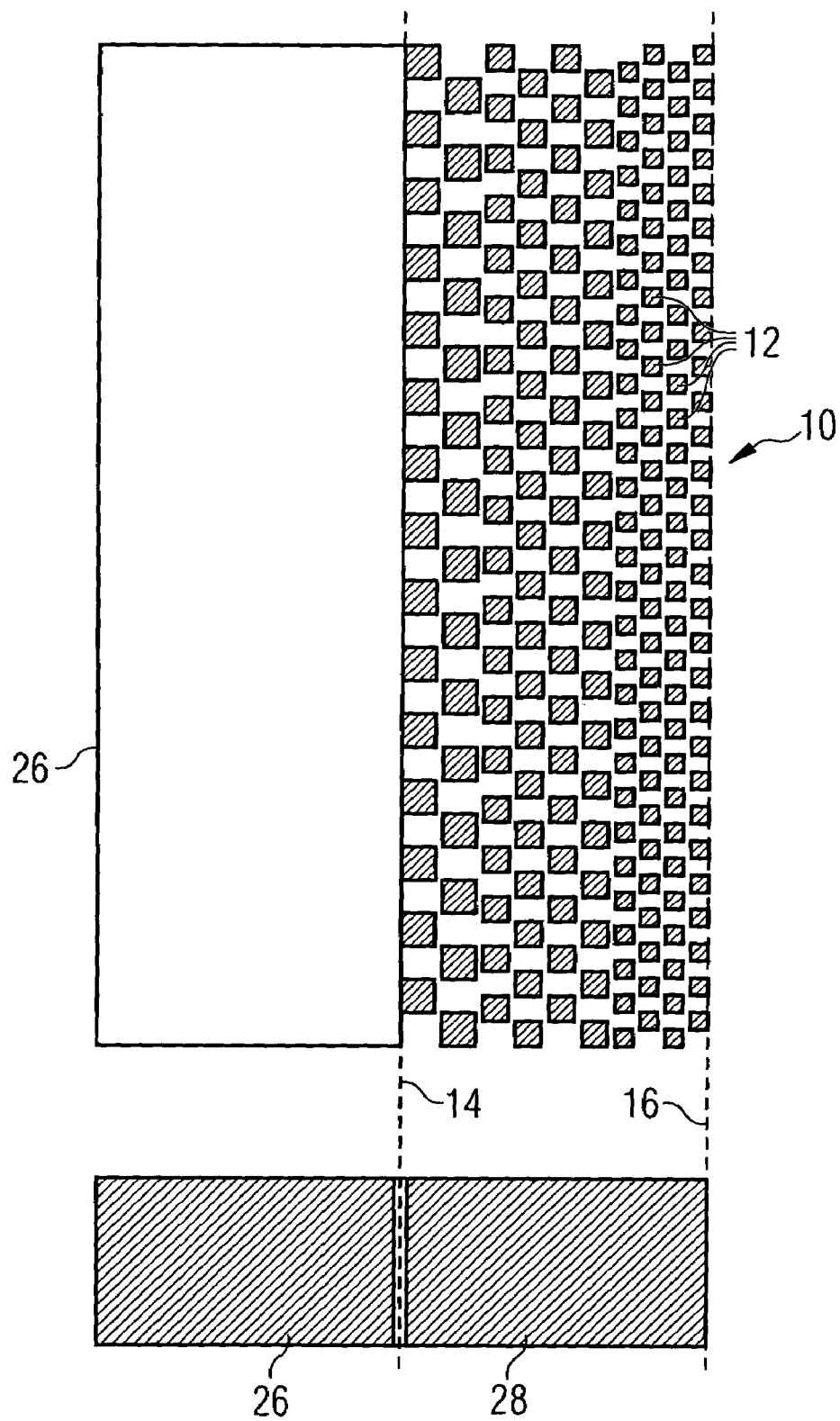
FIG. 2 shows the same pattern as FIG. 1 but with additional elements including a reference pattern.

Another embodiment is shown in FIG. 2. The structural elements 12 can be disposed on a photo mask 30 next to a rectangular shaped bar 26, which is located in parallel to and next to the first edge 14. In addition a reference pattern 28 is shown, which can have the same width as the distance of the first edge 14 to the second edge 16.

All textures shown in FIG. 2 are disposed on the photo mask 30, using a conventional chrome on glass type mask. In other words, the textures shown in black are disposed as chrome elements on the photo mask 30 with an appropriate thickness, e.g., 100 nm.

Figure 3:
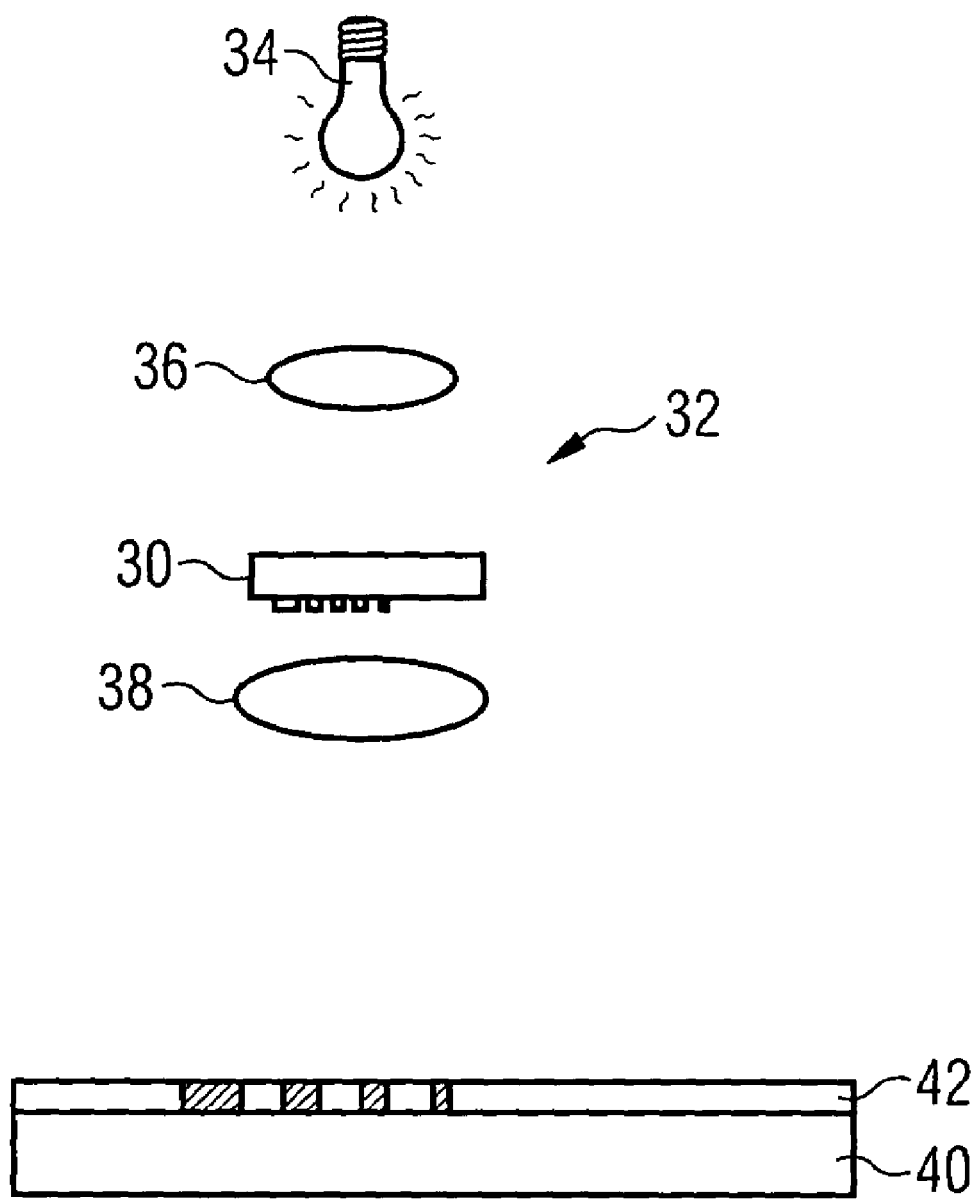
FIG. 3 diagrammatically shows an arrangement comprising an exposure tool with a wafer and a photo mask in a side view.

With respect to FIG. 3, a set-up of an exposure tool in a side view is shown. It should be appreciated that FIG. 3 merely serves as an illustration, i.e., components shown in FIG. 3 are not on-scale.

The exposure tool can include a light source 34, which is, e.g., a DUV-laser with 193 nm wavelength. A first lens 36 can project the light coming from the light source 34 onto the photo mask 30. The light passing the photo mask 30, i.e., not being blocked or attenuated by the above mentioned chrome elements, can be projected by second lens 38 onto the surface of a semiconductor wafer 40. The structure projected on the semiconductor wafer 40 can be scaled down, e.g., by factor of 4.

The characteristic feature sizes of the structural elements 12 can depend on the exposure tool and the wavelength used for projection during transferring the pattern 10 onto the semiconductor wafer. For a typical wavelength of 193 nm, the feature sizes of the structural elements 12 can be selected in a range from 70 to 140 nm.

In this case, the first edge 14 and the second edge 16 can limit the pattern 10 in a range from 0.5 to 4.0 μm. The semiconductor wafer 40 can have a substrate onto which a photoresist film layer 42 can be deposited. When projecting the pattern 10 onto the photoresist film layer using the photo mask 30 in the exposure tool 32, a latent image of the pattern 10 can be created on the resist film layer 42. The latent image can have two different type of areas, which correspond to different exposure doses during the projection. In other words, the latent image can correspond to the pattern 10 being projected subject to magnification, twisting, or blurring caused by the exposure tool 32. The characteristic focus parameter of the exposure tool 32 can be one parameter, which affects the quality of the projection and hence the dimensional accuracy of the projection step.

After developing the photoresist film 42 layer, a three dimensional resist pattern 44 can be formed on the surface of the substrate by removing those parts of the photoresist film layer 42, which are exposed with an exposure dose above the exposure dose threshold of the resist film layer 42.

Figure 4:
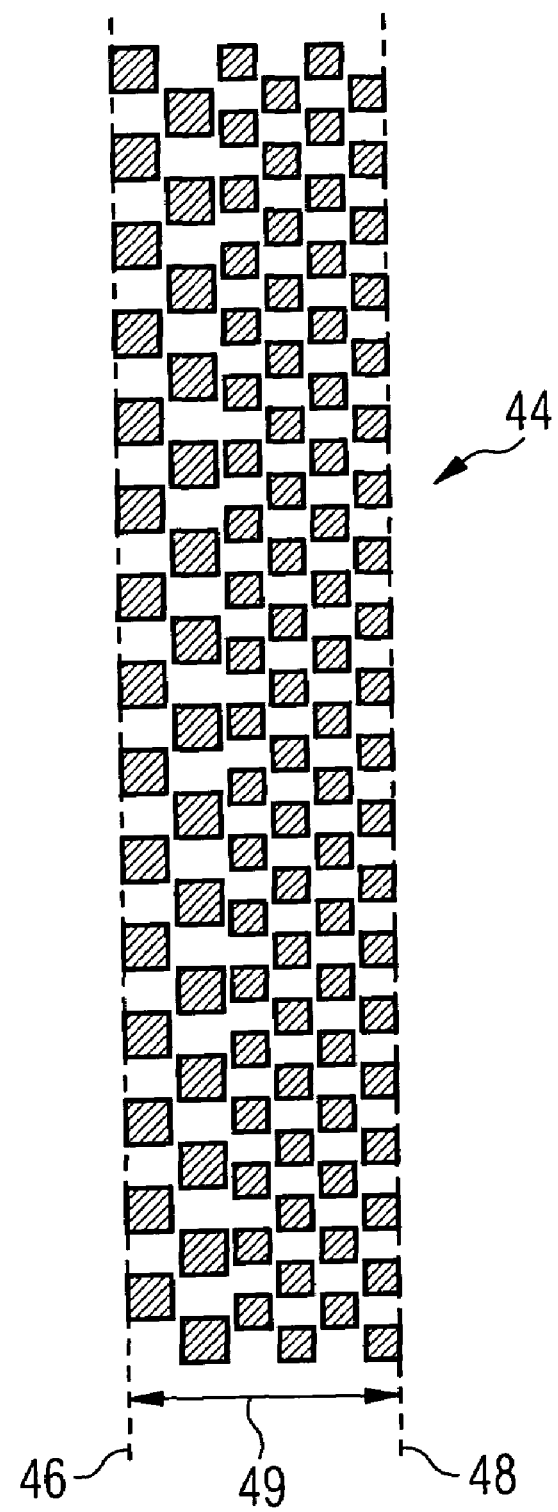
FIG. 4 shows a resist pattern printed on the surface of a semiconductor wafer using the pattern according to FIG. 1.

As shown in FIG. 4, the developed resist pattern 44 can correspond to the pattern 10 and can have a corresponding first edge 46 and a corresponding second edge 48. Structural elements, which are below the minimal resolution of the exposure tool, may however not be printed on the surface of the semiconductor wafer 40. In addition, it is possible that some elements of the resist pattern 44 can disappear (by falling over or otherwise getting lifted off) during the development process, if the size is too small. Hence, the resist pattern 44 can have a first dimension 49 between the corresponding first edge 46 and the corresponding second edge 48, which is smaller as compared to the original pattern 10 on the photo mask 30 scaled by the magnification of the exposure tool 32.

The characteristic focus parameter of the exposure tool 32 can be derived by determining the first dimension 49 of the resist pattern. This can be achieved by measuring the resist pattern 44 with an metrology tool 50, as shown in FIG. 5.

Figure 5:
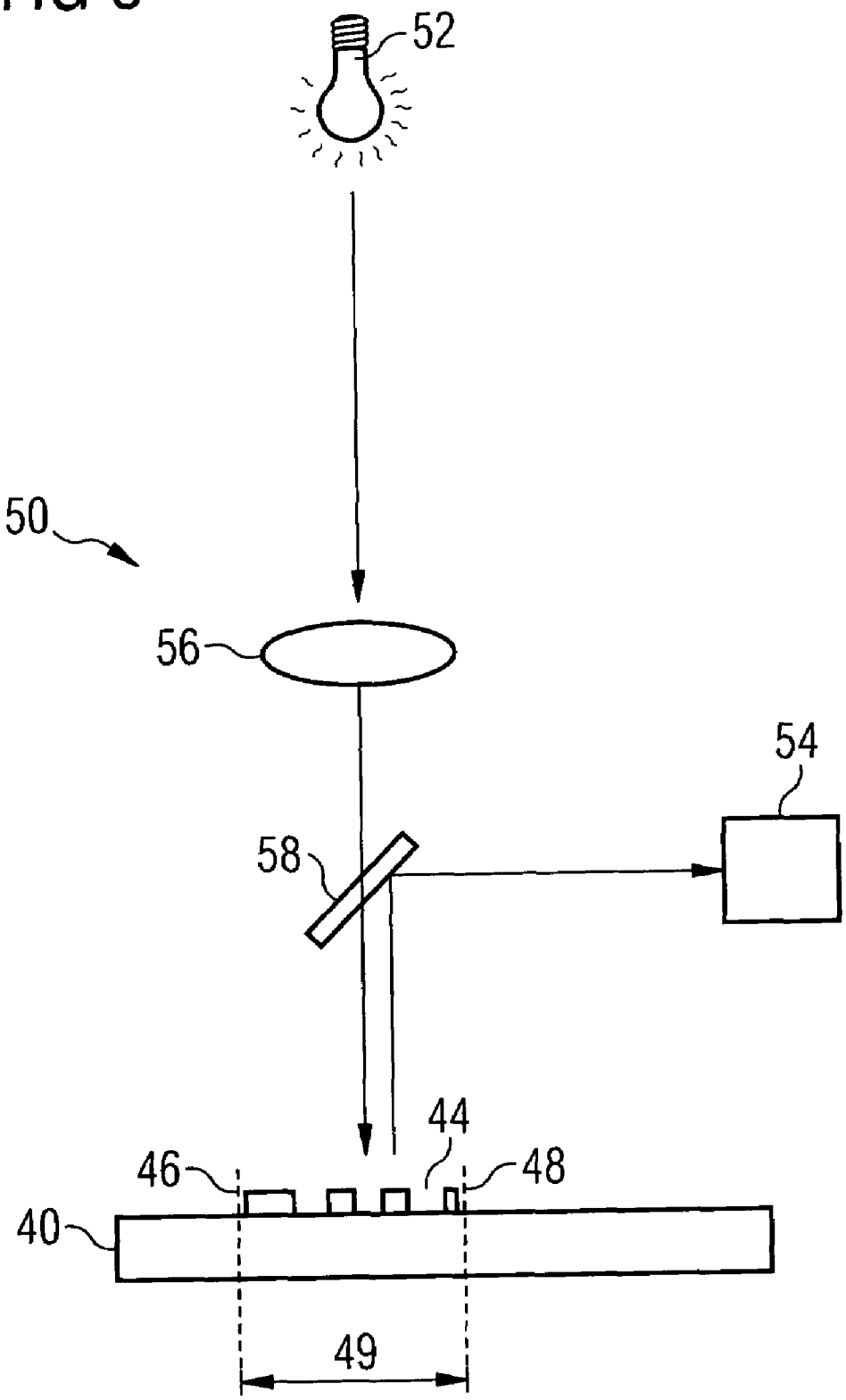
FIG. 5 diagrammatically shows an inspection tool in a side view.

For simplicity, FIG. 5 shows only four structural elements of the resist pattern 44. The resist pattern can be achieved by projecting the pattern 10 according to FIG. 3. The rightmost element of pattern 10 in FIG. 3 can have, in this case, a feature size, which is not projected onto the resist film layer.

An optical metrology tool can include a light source 52 and a microscope 54. As shown in FIG. 5, the light source can be disposed above the wafer 40 and can illuminate the surface of the semiconductor wafer 40 through a lens 56. The scattered light from the surface of wafer 40 can be projected to the microscope 52 using a semi-transparent mirror 58.

The microscope 54 can record an image of resist pattern 44, e.g., by utilizing a CCD-camera (not shown). The recorded image can be contained within a measurement window, which can be large enough to include the corresponding first edge 46 and the corresponding second edge 48 of the resist pattern 44. The first dimension 49 of the resist pattern 44 can be determined using an intensity distribution of the recorded image and calculating the center of gravity value of the image distribution.

In summary, the above described method can relate the size of the resist pattern 44 to the focus parameter of the exposure tool 32. As the resist pattern 44 can be composed of structural elements, which have characteristic feature sizes larger than the minimal resolution of the exposure tool 32, its size depends on the focus parameter of the exposure tool 32. The focus parameter of the exposure tool 32 can be derived from the image distribution of the resist pattern 44 during metrology by calculating, e.g., the center of gravity of the distribution.

However, the reference pattern 26, as shown in FIG. 2, is not affected by the focus parameter of the exposure tool 32 as its size is well above the minimal resolution of the exposure tool 32. A comparison of the size of the reference pattern 26 to the size of the resist pattern 44 can yield to an assessment of the actual focus parameter, as will be described below.

Figure 6:
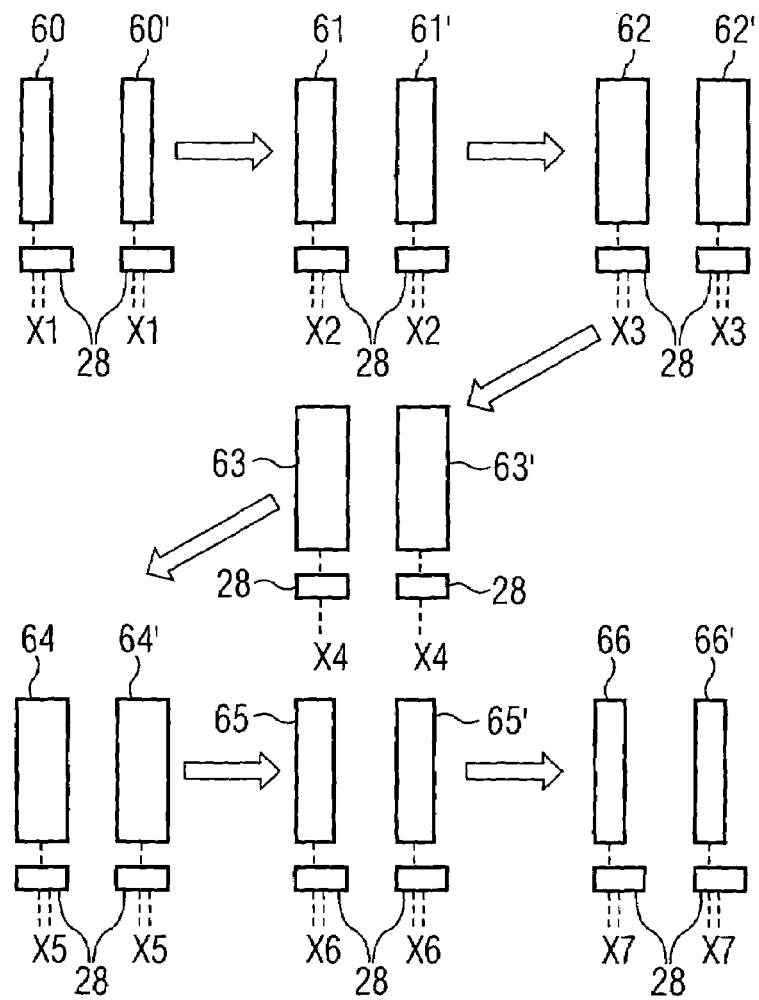
FIG. 6 shows resist patterns under varying focus conditions using a photo mask with a pattern according to FIG. 1 together with a reference pattern.

With respect to FIG. 6, several resist patterns 60 to 66 are shown, which were subsequently projected onto a semiconductor wafer with the exposure tool 32. It should be noted that or a better accuracy of the measured values two identical resist patterns 60 to 66 and 60' to 66' can be projected adjacent to each other for each exposure. This allows, e.g., to calculate a mean value for the corresponding first dimension of the resist patterns 60 to 66.

The photo mask 30 being used can include the pattern in accordance to FIG. 2. For simplicity, the structural elements of the patterns are not individually resolved in the illustration of FIG. 6.

Together with resist patterns 60 to 66, the reference pattern 28 can be formed on the surface of the substrate. Each of the resist patterns 60 to 66 can be projected with a different focus parameter setting. The focus settings can be chosen such that for subsequent exposures the focus parameter moves through an optimal setting. In other words, the focus parameter can vary for each exposure from a defocused setting for resist pattern 60 through the optimal focus setting for resist pattern 63 to a defocused setting for resist pattern 66. Accordingly, the size of the resist patterns can be a direct measure for the focus parameter.

Figure 7:
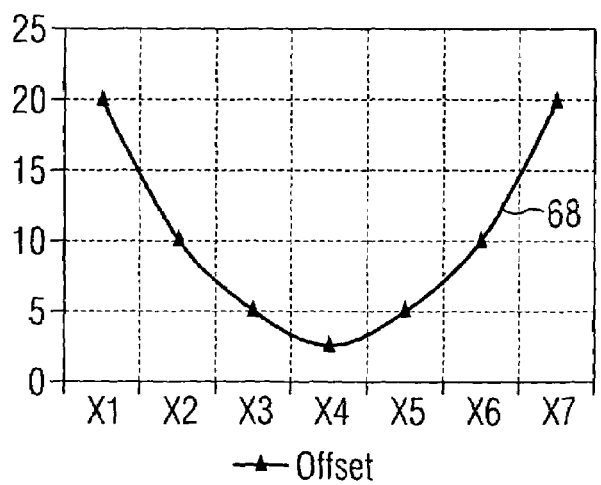
FIG. 7 shows measurement results of dimensional sizes of the resist patterns of FIG. 6.

In FIG. 7, the difference between the center of gravity values of the resist patterns 60 to 66 and the corresponding reference patterns 26 can be plotted as curve 68. The horizontal axis can correspond to the individual measurements, while the vertical axis can display the offset between the center of gravity values of the resist patterns and the corresponding reference pattern. From FIG. 7, the optimal focus parameter can be derived by searching for a minimum value of the offset in curve 68.

Figure 8:
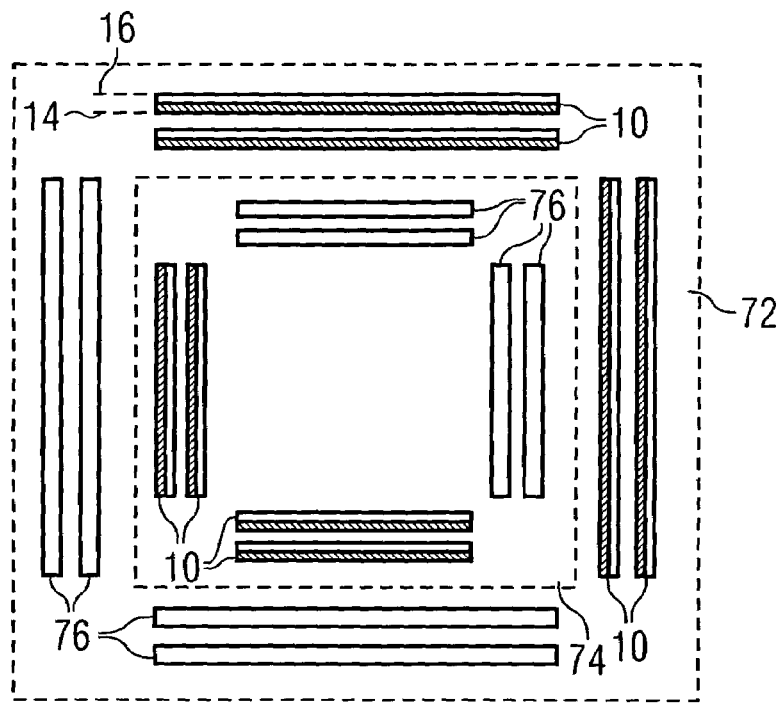
FIG. 8 shows the pattern of FIG. 1 integrated as a sub-element into an overlay mark.

FIG. 8 shows another embodiment of the present invention. The structure projected on the wafer can include an overlay mark 70. Overlay marks 70 can be employed as box like structures, which can include an outer part 72 and an inner part 74. With an overlay metrology tool the difference between the position of the outer part 72 and the inner part 74 can be measured.

In FIG. 8, the outer part 72 can include two rectangular shaped bars 76 disposed horizontally in the lower part of the mark and vertically in the left part of the mark. In the upper part and in the right part of the overlay mark 70, the rectangular shaped bars can be replaced by the pattern 10 according to FIG. 1.

In FIG. 8, the inner part 74 can include two rectangular shaped bars 76 disposed horizontally in the upper part of the overlay mark 70 and vertically in the right part of the overlay mark 70. In the lower part and in the left part of the overlay mark 70, the rectangular shaped bars 76 can be replaced by the pattern 10 according to FIG. 1.

For simplicity, the structural elements of pattern 10 are not illustrated individually resolved in FIG. 8. The structural elements towards the second edge 16, which have smaller feature sizes, can be indicated by a brighter color.

When determining the overlay value with an overlay metrology tool the relative position of the inner part 74 of the overlay mark 70 can be compared to the outer part 72 of the overlay mark 70. Different focus parameter during subsequent exposures of the overlay mark 70 can affect the position of the inner part 74 and the outer part 72 in opposite directions.

Figure 9:
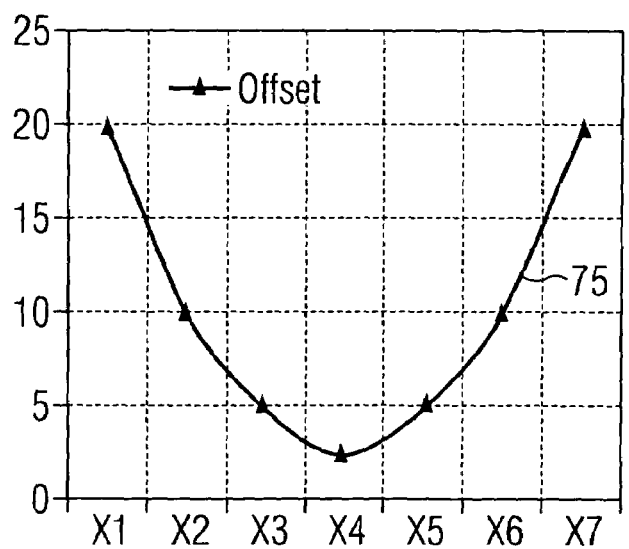
FIG. 9 shows measurement results of dimensional sizes of a corresponding resist pattern using the pattern of FIG. 8.

The residual shift between the position of the inner part 74 and the outer part 72 is shown in FIG. 9 as curve 75. For best focus conditions, the measured offset can be minimal. According to the above described method, the focus parameter of the exposure tool can be derived using a conventional overlay metrology tool.

Figure 10:
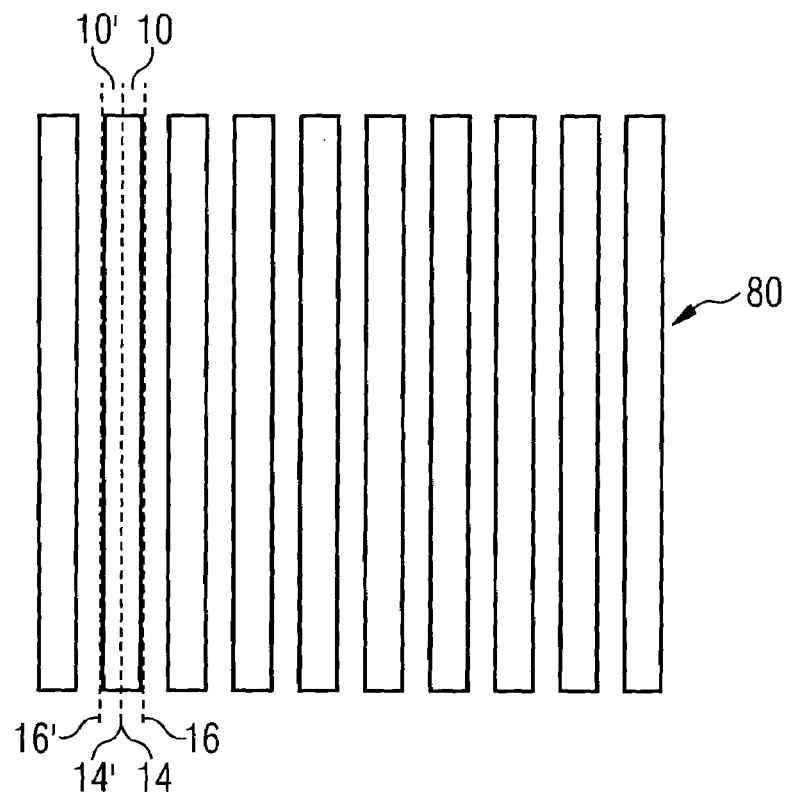
FIG. 10 shows the pattern of FIG. 1 integrated as a sub-element into a CD measurement structure.

FIG. 10 shows yet another embodiment of the present invention. The structure projected on the wafer can be similar to CD-SEM bars, which are well known in the art. CD-SEM bars can be employed by parallel oriented bars 80.

In FIG. 10, each of the CD-SEM bars can be replaced by two patterns according to FIG. 1 with the first pattern 10' being mirrored with respect to the second pattern 10. The patterns can be disposed such, that the first edge 14' of the first pattern 10' and the first edge 14 of the second pattern 10 can be oriented adjacent to each other.

A CD-SEM measurement can be performed with a scanning electron microscope or an optical scatterometry tool. When determining the CD value with the SEM tool or the scatterometry tool, the sizes and profiles of the individual CD-SEM bars can be measured. Different focus parameter during subsequent exposures of pattern 80 can affect the measured size and profile.

Figure 11:
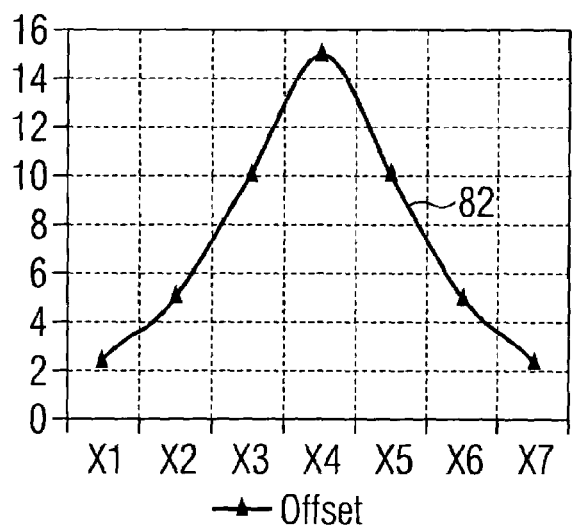
FIG. 11 shows measurement results of dimensional sizes of a corresponding resist pattern using the pattern of FIG. 10.

The measured size is shown in FIG. 11 as curve 82. For best focus conditions, the measured size can reach a maximal value as the number of structural elements, which are not resolved by the exposure can be reduced. According to the above described method, the focus parameter of the exposure tool can be derived using a conventional scanning electron microscope or an optical scatterometry tool.

In the previous embodiments, the patterns formed on the resist film layer can be exposed in a clear field imaging technique onto the substrate of the semiconductor wafer. In other words, the structural elements 12 of the pattern 10 on the photo mask can correspond to pillars including the photo resist after developing and etching. This kind of exposure is well known for positive photo resists. It should be noted however, that the above described invention can also be used in dark field imaging which is frequently being used, e.g., for trenches or contact hole layers in semiconductor manufacturing.

Figure 12:
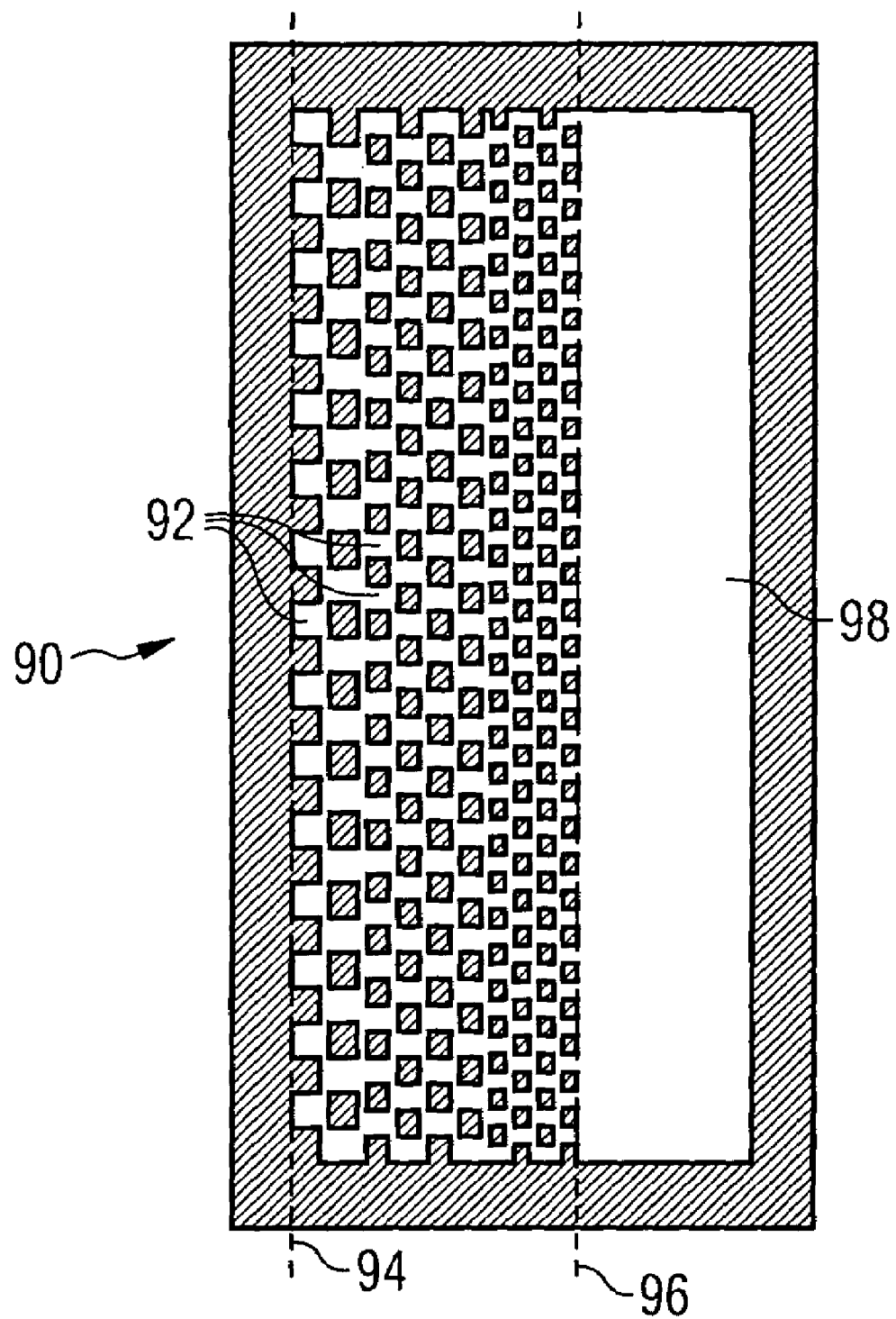
FIG. 12 illustrates a pattern with structural elements on a photo mask usable for dark-field imaging.

FIG. 12 shows in a further embodiment a pattern 90 used for dark field imaging.

Again the pattern 90 can include structural elements 92, having characteristic feature sizes. The pattern 90 can have a first edge 94 and a second edge 96 limiting the size of the pattern 90. The characteristic feature size of the structural elements can be similar to the pattern 10 according to FIG. 1.

When disposing this pattern 90 on a photo mask, the structural elements 92 in this case can form holes in an absorbing layer of the photo mask. In addition, the absorbing layer can be removed next to the second edge 96 of pattern 90 in a rectangular shaped area 98. When projecting this pattern 90 on the resist film layer, the structural elements 92 (shown in dark color) can form holes in the resist film layer instead of pillars, as discussed with respect to FIG. 1.

Figure 13:
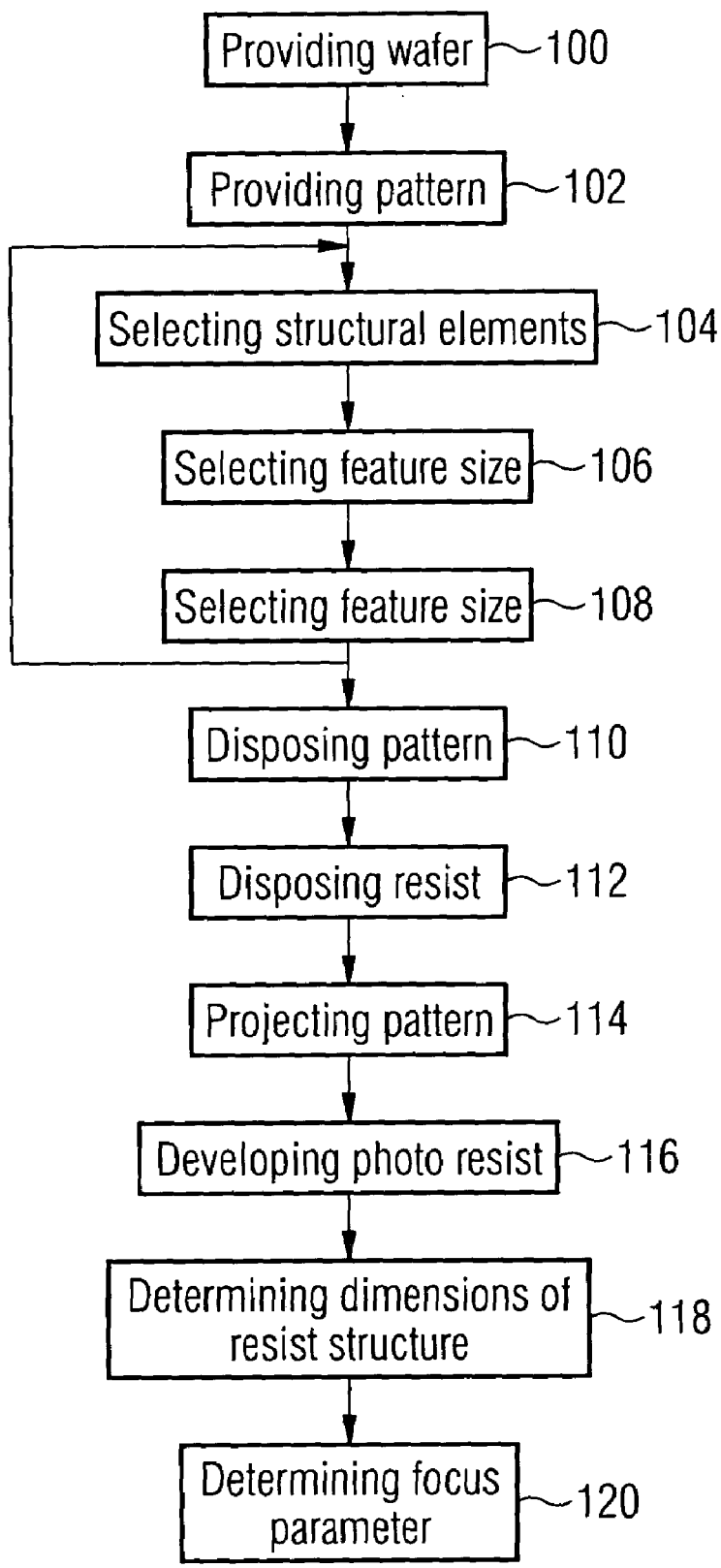
FIG. 13 is a flow chart of the inventive method according to an exemplary embodiment.

Referring to FIG. 13, in step 100, a bare semiconductor wafer substrate or a substrate can be formed by depositing a film onto the surface of a semiconductor wafer is provided.

In step 102, a pattern having a first edge and a second edge can provided such that the first and second edge can be substantially parallel and limit the pattern, which can include a plurality of structural elements. Each of the structural elements can have a characteristic feature size.

In step 104, a first structural element and a second structural element can be selected. The first structural element can have a first distance to the first edge and the second structural element can have a second distance to the first edge.

In step 106, the characteristic feature size of the first structural element can be larger than the characteristic feature size of the second structural elements, when the first distance is larger than the second distance.

In step 108, the characteristic feature size of the first structural element can be substantially equal to the characteristic feature size of the second structural elements, when the first distance is substantially equal to the second distance.

In step 110, the pattern can be disposed on a photo mask.

In step 112, a photoresist film layer can be deposited on a surface of the substrate.

In step 114, the pattern can be projected onto the photoresist film layer using the photo mask in the exposure tool having a characteristic focus parameter.

In step 116, the photoresist film layer can be developed to form a three-dimensional resist pattern on the surface of the substrate by removing a first part of the photoresist film layer being exposed with a first exposure dose. The resist pattern can correspond to the pattern and can have a corresponding first edge and a corresponding second edge.

In step 118, a first dimension of the resist pattern can be determined between the corresponding first edge and the corresponding second edge.

In step 120, the characteristic focus parameter of the exposure tool can be determined as a function of the first dimension of the resist structure.

Having described embodiments for a method and an arrangement for controlling focus parameters of an exposure tool in a lithographic process for patterning a substrate of a semiconductor wafer, it is noted that modifications and variations can be made by persons skilled in the art in light of the above teachings. It is appreciated that the present invention provides many applicable inventive concepts that can be embodied in a wide variety of specific contexts. The specific embodiments discussed are merely illustrative of specific ways to apply the method of the invention, and do not limit the scope of the invention. It is therefore to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

REFERENCE NUMERALS pattern 10
structural elements 12
first edge 14
second edge 16
first structural element 18, 18'
second structural element 20, 20'
first distance 22, 22'
second distance 24, 24'
bar 26
reference pattern 28
photo mask 30
exposure tool 32
light source 34
first lens 36
second lens 38
semiconductor wafer 40
photoresist film layer 42
resist pattern 44
corresponding first edge 46
corresponding second edge 48
first dimension 49
metrology tool 50
further light source 52
microscope 54
further lens 56
mirror 58
resist pattern 60-66, 60'-66'
curve 68
overlay mark 70
outer part 72
inner part 74
curve 75
bar 76
CD-SEM bar 80
curve 82
dark field pattern 90
structural elements 92
first edge 94
second edge 96
rectangular area 98
method steps 100-120

What is claimed is:

1. A method for controlling focus parameters of an exposure tool in a lithographic process for patterning a substrate of a semiconductor wafer, comprising:

providing a bare semiconductor wafer substrate or a substrate formed by depositing a film onto the surface of a semiconductor wafer;

providing a pattern having a first edge and a second edge, the first edge and the second edge being substantially parallel and limiting the pattern, the pattern including a plurality of structural elements, each of the structural elements having a characteristic feature size;

selecting a first structural element and a second structural element, the first structural element having a first distance to the first edge and the second structural element having a second distance to the first edge;

selecting the characteristic feature size of the first structural element larger than the characteristic feature size of the second structural elements when the first distance is larger than the second distance;

selecting the characteristic feature size of the first structural element substantially equal to the characteristic feature size of the second structural elements when the first distance is substantially equal to the second distance;

disposing the pattern on a photo mask;

depositing a photoresist film layer on a surface of the substrate;

projecting the pattern onto the photoresist film layer using the photo mask in the exposure tool having a characteristic focus parameter;

developing the photoresist film layer to form a three-dimensional resist pattern on the surface of the substrate by removing a first part of the photoresist film layer being exposed with a first exposure dose, the resist pattern corresponding to the pattern and having a corresponding first edge and a corresponding second edge;

determining a first dimension of the resist pattern between the corresponding first edge and the corresponding second edge; and determining the characteristic focus parameter of the exposure tool as a function of the first dimension of the resist structure.

2. The method according to claim 1, wherein the structural elements are square shaped and wherein the characteristic dimension is the area of each the square shaped element.

3. The method according to claim 1, wherein the structural elements are circular shaped and wherein the characteristic dimensions is the area of each the circular shaped element.

4. The method according to claim 1, wherein the step of providing a pattern includes disposing a reference pattern on the photo mask in proximity of the pattern, the reference pattern having a width which is substantially equal to the distance between the first edge and the second edge.

5. The method according to claim 4, wherein the step of determining the focus of the exposure tool as a function of the first dimension is performed by comparing the first dimension of the resist pattern to the width of the reference pattern.

6. The method according to claim 1, wherein the first edge and the second edge limiting the pattern in a range from 0.5 to 4.0 um.

7. The method according to claim 1, wherein the characteristic feature sizes of the elements are selected in a range from 45 to 250 nm.

8. The method according to claim 1, wherein the resist film layer has an exposure dose threshold, choosing the first exposure dose threshold and the first exposure dose such that the resist pattern forms pillars on the substrate of the semiconductor wafer.

9. The method according to claim 1, wherein the resist film layer has an exposure dose threshold, choosing the first exposure dose threshold and the first exposure dose such that the resist pattern forms holes in the resist film layer on the substrate of the semiconductor wafer.

10. The method according to claim 1, wherein the step of determining the first dimension of the resist pattern includes recording an image in a measurement region, the measurement region including the corresponding first edge and the corresponding second edge.

11. The method according to claim 10, wherein the step of recording the image includes determining an intensity distribution of the image.

12. The method according to claim 11, wherein the step of determining the first dimension of the resist pattern includes calculating the center of gravity value of the image distribution.

13. The method according to claim 10, wherein the step of recording an image is performed during optical inspection, overlay metrology, scatterometry or critical dimension scanning electron microscopy.

14. The method according to claim 13, further comprising:

providing a measurement pattern, the measurement pattern being usable as an overlay target, an alignment mark, a scatterometry mark or a critical dimension measurement bar; and disposing the measurement pattern on the photo mask, wherein the pattern forming a sub portion of the measurement pattern.

15. The method for controlling focus parameters of an exposure tool, comprising:

providing an exposure tool having a characteristic minimal resolution, the minimal resolution depending on a focus parameter of the exposure tool;

providing a line shaped pattern having a width, the line shaped pattern including a plurality of individually sized textures and having a first edge and a second edge, the first edge and the second edge limiting the width of the line shaped pattern;

selecting the feature sizes as a function of the distance of the features to the first edge, the feature sizes decreasing monotonically from a maximum value close to the first edge to a minimum value close to the second edge;

exposing an image of the line shaped pattern onto a resist film layer on a substrate to create a latent image of the line shaped pattern, the latent image having a further width, the further width being less or equal to the width as a function of the minimal resolution;

determining the minimal resolution by comparing the further width of the latent image and the width of the line shaped pattern; and determining the focus parameter as a function of the minimal resolution.

* * * * *